United States Patent [19]

Nackman et al.

[11] Patent Number: 4,797,842

[45] Date of Patent: Jan. 10, 1989

[54] METHOD OF GENERATING FINITE ELEMENTS USING THE SYMMETRIC AXIS TRANSFORM

[75] Inventors: Lee R. Nackman, White Plains; Vijay Srinivasan, Ossining, both of N.Y.

[73] Assignee: International Business Machines Corporation, Armonk, N.Y.

[21] Appl. No.: 97,382

[22] Filed: Sep. 16, 1987

Related U.S. Application Data

[63] Continuation-in-part of Ser. No. 717,368, Mar. 28, 1985, abandoned.

[51] Int. Cl.$^4$ .................. G06F 15/60; G06F 15/62; G06F 15/328
[52] U.S. Cl. .................. 364/578; 364/522; 364/505
[58] Field of Search ............ 364/300, 522, 578, 505; 382/25, 26

[56] References Cited

U.S. PATENT DOCUMENTS

| | | | |
|---|---|---|---|
| 3,805,028 | 11/1974 | Morton | 382/26 |
| 3,939,336 | 2/1976 | Vasiliev et al. | 364/578 |
| 3,976,827 | 8/1976 | Alien et al. | 382/26 |
| 4,183,013 | 1/1980 | Agrawala et al. | 382/26 |
| 4,192,004 | 3/1980 | Buerger | 382/26 |
| 4,361,830 | 11/1982 | Honma et al. | 382/25 |
| 4,404,684 | 9/1983 | Takada | 382/25 |

FOREIGN PATENT DOCUMENTS

| | | | |
|---|---|---|---|
| 926667 | 5/1982 | U.S.S.R. | 364/510 |
| 1104513 | 7/1984 | U.S.S.R. | 364/735 |

Primary Examiner—Felix D. Gruber
Attorney, Agent, or Firm—Sughrue, Mion, Zinn, Macpeak and Seas

[57] ABSTRACT

A method, amenable to automation, for generating finite elements of a geometric model. The model is first subdivided into coarse subdomains and then the coarse subdomains are further subdivided. The coarse subdivision is performed using a symmetric axis transform which generates axes symmetric to opposing boundaries of the object. The transform also generates a radius function of the axes giving the distance between the axes and the boundaries. A coarse subdomain is created between each single non-branching section of the axes and one of its associated boundaries. The fine subdivisions of the relatively simple coarse subdomains is performed by well known techniques or can beneficially use the radius function.

19 Claims, 4 Drawing Sheets

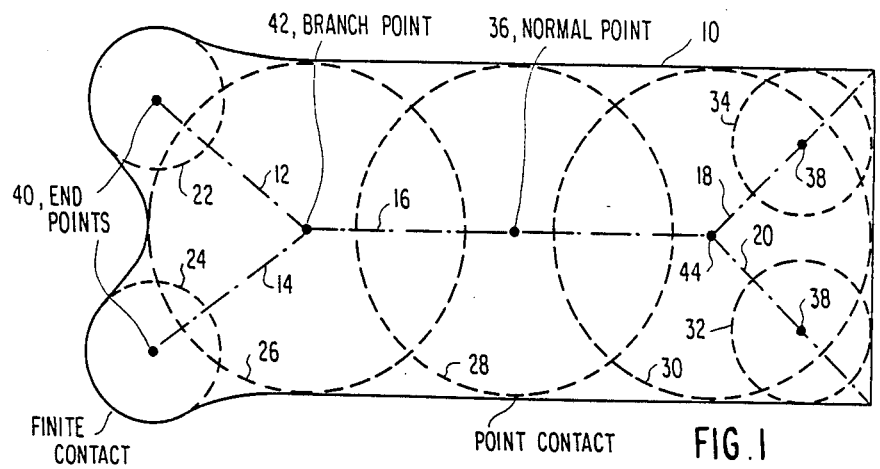
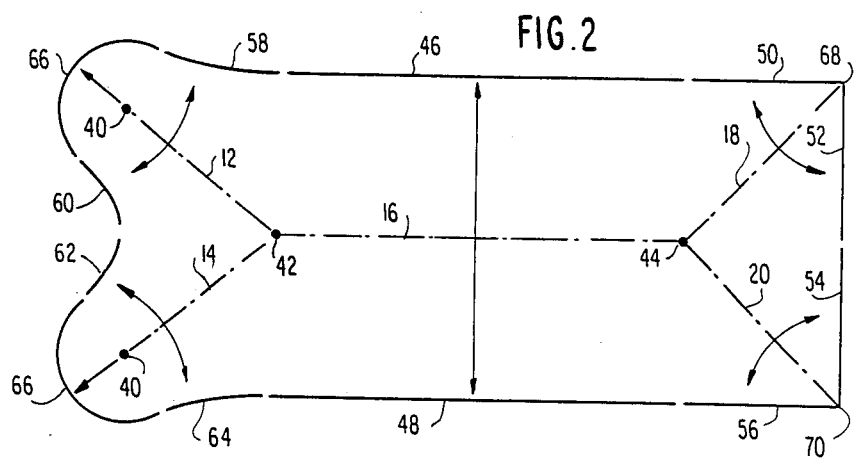
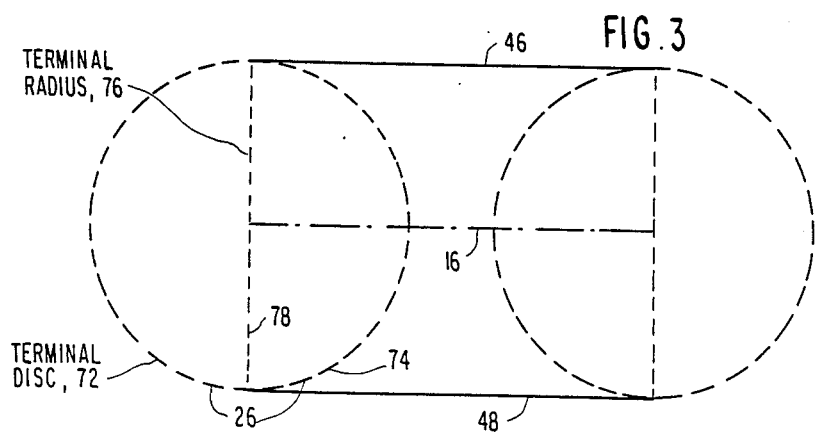

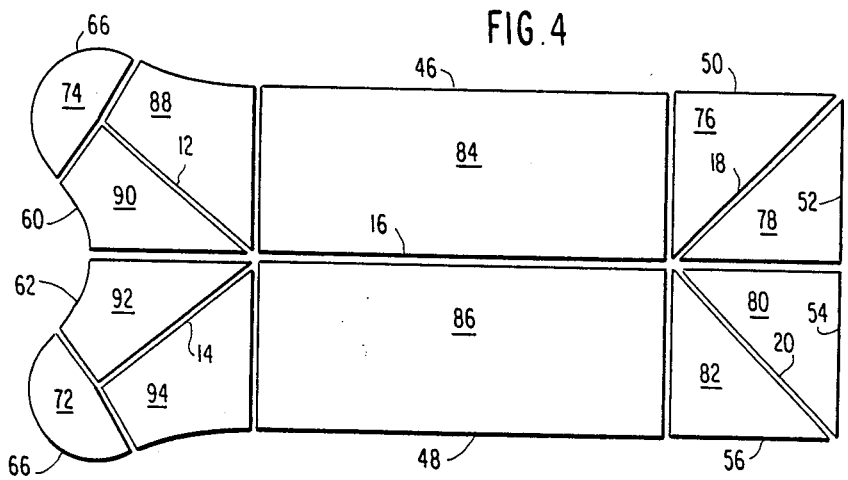
FIG. 4
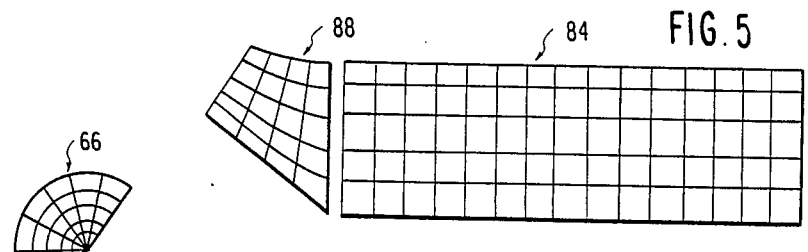
FIG. 5
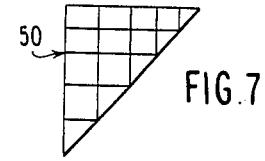
FIG. 6
FIG. 7
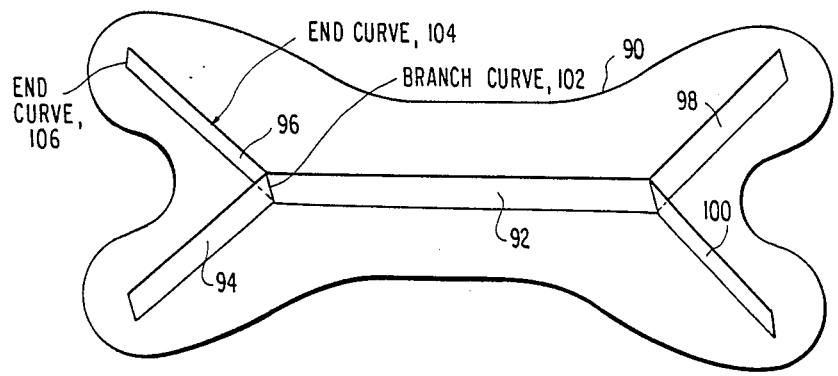
FIG. 8

METHOD OF GENERATING FINITE ELEMENTS USING THE SYMMETRIC AXIS TRANSFORM

This is a continuation-in-part of application Ser. No. 06/717,368 filed Mar. 28, 1985 and now abandoned.

Field of the Invention

The invention relates generally to a numerical simulation. In particular, the invention relates to a method of automatically generating from a geometric model the finite elements to be used in the simulation.

Background Art

Many problems in various fields of technology require the solution of partial differential equations. Example problem areas include heat transfer, stress and vibration analysis, diffusion, fluid flow and electric and magnetic fields. Very few realistic partial differential equations can be solved exactly. Mathematical approximations are available for some types of problems. However, the approximations may be difficult to apply to some problems and the approximations are not of general applicability but are suitable only to particular classes of problems. Furthermore, determining the accuracy of the approximation is itself a major task.

As a result of these problems and the availability of modern computer power, it has become increasingly common to rely upon finite element modelling. In finite element modelling, the domain of the computation, usually the spatial coordinates, is divided into finite elements. Each finite element is approximated to have uniform properties throughout the particular finite element. The partial differential equations are converted to difference equations based upon the variation of these properties across neighboring finite elements. The difference equations for all finite elements can be solved by numerical methods, usually involving a fairly large set of simultaneous linear equations. Very often, the difference equations are solved for a sequence of time periods with another set of difference equations used for the temporal variations.

A relatively simple finite element problem could involve simulating a square two-dimensional box. The easiest approach would be to divide both dimensions uniformly to produce a series of square finite elements. The boundary values for the partial differential equation are applied only to the sides of the original large box with the partial differential equation determining the difference equations between the smaller boxes. Although this simple type of simulation has been very useful, the finite element method has been applied to much more complex problems.

If the volume to be simulated does not conform to a rectangular or other symmetric geometry, then the finite element simulation also does not have symmetric form. An example of such an unsymmetric domain is shown in FIG. 1. Although the right side of the example domain is readily decomposed into rectangular finite elements, the left side is only poorly represented by the same type of rectangular elements. Nonetheless, a skilled numerical analyst viewing the problem domain of FIG. 1 can generate a set of finite elements that vary from the right to the left side of FIG. 1. Nonetheless, this important part of finite element modelling can be very time-consuming for relatively complex geometries and it has been estimated that in some applications 80 percent of the analyst's time is spent in generating these finite elements. Thus the element generation has become the rate limiting step, particularly in an iterative design process in which the problem domain changes from one step to the next, thus requiring a new generation of the elements at each step.

There is an obvious need to automate the generation of finite elements for complex boundaries. However, pattern recognition, relatively simple in two dimensions for the human mind, presents a difficult computer problem. Numerous patents have addressed various aspects of extracting shape information from a data array. See, for example, U.S. Pat. Nos. 3,805,028 to Morton, 3,976,827 to Alien et al, 4,183,013 to Agrawala et al, 4,192,004 to Buerger and 4,361,830 to Honma. Takeda in U.S. Pat. No. 4,404,684 describes hardware for sensing the shape of an object.

Wordenweber, in a technical article entitled "Finite-Element Analysis for the Naive User" appearing in *Solid Modelling by Computers: From Theory to Application: Proceedings*, General Motors Research Lab, Warren, Mich., Sept. 25-27, 1983, proposed a two-step automatic element generation in which multiply connected domains are subdivided into simply connected domains in the first step. Shephard et al in the same proceedings describe making the first subdivision automatic using an octree approach. The automatic triangulation approach is described by Cedres in "Electromagnetic Modelling Techniques Using Finite Element Methods", Technical Report, Electrical and Computer Engineering Dept., Carnegie-Mellon Univ. (1983).

An additional problem is that conceptualizing a complex shape in three dimensions is difficult. Interactive elements generation tools are available but, particularly in three dimensions, they prove awkward.

SUMMARY OF THE INVENTION

Accordingly, an object of this invention is to provide for the automatic generation of finite elements.

A further object of this invention is to provide for such automatic finite element generation in a three-dimensional model.

The invention can be summarized as a method for automatically generating finite elements of an object. The object is defined by a geometric model. The geometric model is divided first into coarse domains using Blum's symmetric axis transform which generates symmetric lines or surfaces between the boundaries of the geometric model. The symmetric axis transform produces the coarse domains between the surface of the geometric model and the symmetric axes. The boundaries of the coarse domains are available also from the transform. The coarse domains have relatively simple shapes, such as triangles and quadrilaterals of curved sides in two-dimensional models. These relatively simple coarse domains can be decomposed simply into yet smaller fine domains.

BRIEF DESCRIPTION OF THE DRAWINGS

FIG. 1 illustrates a two-dimensional geometric model and identifies different classes of points in the symmetric axis transformation.

FIG. 2 illustrates the decomposition of the domain of FIG. 1 by the symmetric axis transform.

FIG. 3 illustrates terminal disc and radius definition.

FIG. 4 illustrates the decomposition of the figure of FIG. 1 into coarse subdomains.

FIG. 5 illustrates the decomposition of quadrilateral coarse subdomains into finite elements.

FIGS. 6 and 7 illustrate the decomposition of triangular coarse subdomains into finite elements.

FIG. 8 illustrates a symmetric surface in three dimensions.

DETAILED DESCRIPTION OF THE PREFERRED EMBODIMENTS

Figure 9:
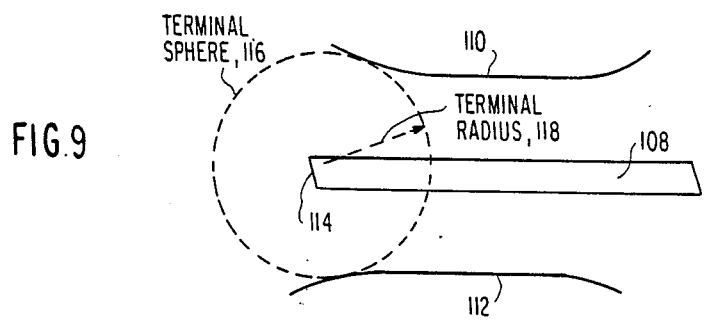
FIG. 9 illustrates definitions required for a three-dimensional decomposition.

The invention uses the symmetric axis transform of the geometric model to produce the coarse subdomains with no further input. The relatively simple coarse subdomains can then be divided into fine subdomains by using one of several standard mapping procedures, well known in the art. These procedures can take into account parameters which affect locally the density and size of the generated finite elements. This specification will describe in some detail the procedure for a coarse subdivision in a two-dimensional model. A less detailed description will be made for the coarse subdivision in three dimensions. The fine division can be performed either by already well known techniques, such as mapping or triangulation, or by making use of the shape information available in the radius function of the symmetric axis transform.

A two-dimensional figure is the union of the boundary and the interior of a multiply-connected domain. The boundary is smooth except at a finite number of points, at which the boundary must have one-sided tangents. Thus, figures include simple polygons, simple polygons bounded by simple polygons, etc. The sides of such polygons may each be curved. A polygon here includes within its definition a unigon such as a circle.

The symmetric axis of a figure F is defined as the locus of the centers of all maximal discs of the figure F, that is, those discs contained in F but completely contained in no other disc in F. The radius function is defined to be the distance from each point on the symmetric axis to the nearest point on the boundary. The symmetric axis together with its radius function form the symmetric axis transform (SAT) of F. A symmetric axis transform of F is equivalent to the figure F. In FIG. 1, the boundary 10 is the two-dimensional figure F. Lines 12, 14, 16, 18 and 20 together form the symmetric axes of F. For each point on these lines 12-20 there is a uniquely defined value of the radius function, for example, the radii of the various maximal discs 22, 24, 26, 28, 30, 32 and 34.

A point on the symmetric axis of the figure can be classified into one of three types. This classification will be done both mathematically and intuitively. For every point on the symmetric axis there is a disjoint subset comprising its set of nearest neighbors. The three types of points depend upon the order of the point, that is, the number of points in the disjoint subset for that point. End points are of order one, normal points are of order two, and branch points are of order three or more, corresponding to the maximal disc of that point touching the boundary in one, two, or more disjoint arcs respectively. In intuitive terms, a normal point is shown by points 36 and 38 which are intermediate points of continuous lines. End points 40 are the terminating points for the symmetric axis. Branch points 42 and 44 are the points of branching. Points on the symmetric axis are further divided into point contact points and finite contact points. A point is a point contact point if the maximal disc associated with that point touches the boundary 10 at only single points. Otherwise, the point is called a finite contact point. In FIG. 1, all points are point contact points except the two end points 40. However, different situations from those illustrated are possible.

Thus there is a mapping function from the boundary of the figure F to the symmetric axis of F. This function maps each point on the boundary 10 to the center of the maximal disc that is a tangent to the boundary 10 at that point. Each contiguous open interval of normal points, such as lines 12, 14, 16, 18 and 20 in FIG. 3, is called a simplified segment. With each simplified segment, the inverse of the mapping function associates two disjoint portions of the boundary 10. This decomposition of the boundary is shown in FIG. 2. The portions 46 and 48 are associated with line 16; portions 50 and 52, with line 18; portions 54 and 56, with line 20; portions 58 and 60 with line 12; and portions 62 and 64, with line 14. Consequently, the figure F can be decomposed into a collection of two-sided parts, each associated with a simplified segment of the symmetric axis of that same figure, together with a collection of (possibly degenerate) circular sectors, each associated with a branch point or an end point. In FIG. 2, the circular sectors 66 are associated with respective end points 40.

This completes the description of the symmetric axis transform which has been described by Blum et al in a technical article entitled "Shape Description Using Weighted Symmetric Axis Features", appearing in *Pattern Recognition*, Volume 10, No. 3 (1978), pp. 167–180. A suggestion has been made to the inventors by another to investigate the use of Blum's symmetric axis transform for finite element generation but this use is believed by the inventors to not have been accomplished heretofore.

According to the invention, the figure enclosed by the boundary 10 is subdivided into coarse subdomains according to both the simplified segments and the separate portions of the boundary 10 as shown in FIG. 2. A few more definitions are required for this coarse subdivision. A terminal point of a simplified segment is either a branch point or an end point that bounds that simplified segment. For example, the simplified segment 16 is bounded by the two branch points 42 and 44 while the simplified segment 14 is bounded by the end point 40 and the branch point 42. It should be noted that the boundary corner points 68 and 70 are actually degenerate circular sectors so that these points 68 and 70 are end points.

A further definition is that the terminal disc associated with a terminal point is the maximal disc centered at that terminal point. Referring to FIG. 1, the maximal disc 26 is the terminal disc associated with the branch point 42 and each of the maximal discs 22 and 24 is a terminal disc associated with a respective end point 40.

Each terminal disc associated with a terminal point is partitioned into one or more (possibly degenerate) circular sectors by the points at which the terminal disc makes contact with the boundary 10. As shown in FIG. 3, the terminal disc 26 is divided into two segments 72 and 74. A terminal radius associated with a terminal point is defined as a radius from the terminal point to a boundary point at one of the touching points on the boundary, for example, the terminal radii of a 76 and a 78.

According to the invention, for each simplified segment, two coarse subdomains are defined. Each coarse subdomain is bounded by the simplified segment itself, two terminal radii and a (possibly degenerate) portion of the boundary associated with the simplified segment. Each course subdomain is either a triangle or a quadrilateral. The sides of the triangle or the quadrilateral may possibly be curved but are continuous, that is, having single valued first derivatives. The geometric model of FIGS. 1-3 is subdivided into course subdomains as shown in FIG. 4. The coarse subdomains include triangles 72, 74, 76, 78, 80 and 82 and quadrilaterals 84, 86, 88, 90, 92 and 94.

The coarse subdomains are, in general, unsuitable for direct use as finite elements. The course subdomains do not provide a sufficient number of finite elements between the discontinuities of the boundary. Therefore, each coarse subdomain is further divided in a fine subdivision into finite elements. The coarse subdomains are of relatively simple shapes and can be automatically subdivided using any of the standard mapping techniques described by M. S. Shephard in his article "The Finite Element Modeling Process—Will It Be Automated?", appearing in the book *New and Future Development in Commercial Finite Element Methods*, J. Robinson, ed., Robinson and Associates, Dorset, England, 1982, pp. 451-468. Alternatively, a technique based upon the radius function of the symmetric axis transform can be used. Since the mapping techniques described by Shepard are well known, only the technique using the radius function will be described.

As described above, each point on the symmetric axes are associated with portions of the boundary. Consider traversing a simplified segment in some direction. As the simplified segment is traversed, the arcs of the associated boundaries move toward or away from the simplified segment in a manner determined solely by the behavior of the radius function. The sign of the first derivative of the radius function with respect to the arc length along the simplified segment determines whether the boundary moves toward or away from the segment. The sign of the second derivative of the radius function determines whether the boundary arcs are concave or convex with respect to the simplified segment. Blum et al in the previously cited article describe several measures of shape in two dimensions using the radius function. Thus, using the shape information provided by the radius function, it is possible to automatically generate within each coarse subdomain finite elements with varying density and size.

When the coarse subdomain is a quadrilateral, it can be subdivided into quadrilateral finite elements by the following process:
1. Divide the simplified segment into intervals, where the number and size of the intervals are determined as functions of the properties of the radius function, the curvature of the simplified segment, and the local boundary conditions imposed at the outer boundary.
2. Construct radii between the interval end points and their associated touching points on the object boundary. These radii will have the radius of the radius function and will extend from the simplified segment to the boundary.
3. Divide the radii into an equal number of intervals. The number and size of the intervals are determined as functions of the radius function properties, the curvature of the simplified segment and the local boundary conditions imposed. The intervals along the radii need not be uniform, particularly near a difficult boundary condition or a sharply varying boundary. The fine subdivision of the quadrilaterals 84 and 88 is shown in FIG. 5.

The use of the radius function in the fine subdivision is an important capability. A fine mesh may be required for accuracy near a sharply varying boundary, an interface with another material, or near a source or sink. However the fine mesh is not required in the interior regions away from these difficult boundaries. The large number of finite elements produced by a uniformly fine mesh makes a calculation long and expensive and may introduce computational inaccuracies. Accordingly, it is preferable to vary the local mesh size in accordance with the radius function, the distance along the radius function and a few parameters input by the operator reflecting boundary conditions.

Similarly, triangular coarse subdomains are finely divided into finite elements using the above mentioned procedure. The resultant finite elements are primarily quadrilateral with some triangular finite elements, as shown in FIGS. 6 and 7 for the triangular coarse subdomains 66 and 50. Note that any quadrilateral finite element can be easily subdivided into two triangular elements by creating a diagonal. There are some numerical simulation techniques which prefer the exclusive use of triangular finite elements.

The two-dimensional technique described above can be extended to three or more dimensions. The description and visualization of these higher dimensional decompositions are more difficult but the mathematics remain much the same. The three-dimensional technique will be described below because of its importance to physical problems.

The definition of the two-dimensional symmetric axis transform applies also in three dimensions, except that the maximal discs become maximal spheres and the symmetric axis becomes a symmetric surface. The name symmetric axis is a misnomer because the symmetric surface is usually not a single surface but is instead a collection of surfaces and curves. Whenever an n-dimensional object is described for all its possible number of dimensions, some violence must be made to common language. A two-dimensional sphere is in fact a disc.

One of the inventors, Nackman, has described the symmetric axis transform and measures of shape dependent upon the 3-dimensional radius function in a technical article entitled "Curvature Relations in Three-Dimensional Symmetric Axes", appearing in *Computer Graphics and Image Processing*, Vol. 20 (1982) at pp. 43-57. Blum also describes the three-dimensional symmetric axis transform in "3-D Symmetric Axis Coordinates: An Overview and Prospectus", a draft of a presentation at the NSF Workshop on Representation of Three Dimensional Objects, University of Pennsylvania, May 1-2, 1979, Ed. R. Bajcsy.

As in two dimensions, points on the symmetric surface can be classified into three types: end points, normal points and branch points. In general, end points and branch points are not isolated points, as in two dimensions, but rather may form curves in space. Open connected sets of normal points are called simplified regions and are bounded by (possibly degenerate) space curves of branch and end points. The degenerate curves of branch or end points are a single branch point or end point. In general, each simplified region in three dimensions is a patch of a smooth surface rather than a curve. However, sometimes a simplified region degenerates into a space curve. Let us take as an example of a three-dimensional figure an extension of the two-dimensional figure of FIG. 1. Let the figure be generally radially symmetric about a transverse axis including the line 16. However, let there be a short portion of the three-dimensional figure that is uniform perpendicularly to the two illustrated dimensions for a short distance near the illustrated medial cross-section. The resultant three-dimensional symmetric axis transform of a three-dimensional Figure 90 results, as shown in FIG. 8, in simplified surfaces 92, 94, 96, 98 and 100. A branch curve 102 separates the simplified surfaces 92, 94 and 96. An end curve 104 is associated with the curved top of the Figure 90 and another end curve 106 is associated with the short uniform side portion of the Figure 90. If there were no uniform vertical portion of the Figure 90, then the surfaces 92-100 would degenerate into lines and the curves 102-106 would degenerate into points.

Associated with each point on a simplified region are the boundary points consisting of the nearest neighbors on the boundary. These boundary points are the end points of the radii of the maximal spheres at the tangential point between the spheres and the boundary. Each simplified region then goes up the middle of a two-sided part of the three-dimensional Figure 90. The two-sided part of the Figure 90 is bounded by the two boundary surfaces consisting of the boundary points associated with the points constituting the simplified region. These surfaces are called the boundary surfaces associated with the simplified region. The symmetric axis transform induces a unique decomposition of a three-dimensional FIG. 90 into a collection of these two-sided parts together with canal surface sectors, each associated with a branch or an end curve. A canal surface is the envelope of a family of spheres, possibly of varying radius, with centers lying on a space curve. In this case, the space curve is associated with either a branch curve or an end curve. A canal surface sector is a volume defined by the union of a continuously bearing solid angle of the spheres that define a canal surface. The canal surface sectors are those parts of the three-dimensional FIG. 90 that are in finite contact with the maximal spheres.

The coarse subdivision is derived from the two-sided parts associated with the simplified regions of the symmetric surface. A few more definitions are required. A terminal curve of a simplified region is a branch curve or an end curve that bounds the simplified region. For instance, in FIG. 8, the simplified region 96 is bounded by the branch curve 102 and by the end curves 104 and 106. The third end curve at the bottom of the simplified region 96 is not explicitly referenced. If the branch curve or the end curve degenerates to a point, then the terminal curve, of course, also degenerates to a terminal point. The terminal sphere associated with a point on a terminal curve is the maximal sphere within the three-dimensional figure centered at that point. For instance, in FIG. 9, a simplified region 108 is located between two boundaries 110 and 112. The simplified region 108 has a terminal curve 114. At any point on the terminal curve 114 there is a terminal sphere 116 with a terminal radius 118. The terminal sphere associated with each terminal point is partitioned into one or more degenerate canal surface sectors by its touching subset. The canal surface sector is degenerate in the usual case of point contact with the boundary and is non-degenerate for finite contact. A terminal radius surface associated with a terminal curve is the surface swept out by the radii from the terminal points of the terminal curve to their corresponding boundary points.

Figure 10:
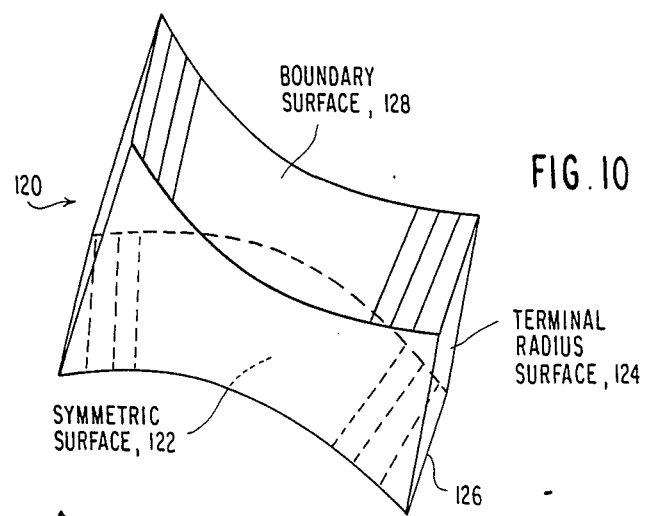
FIG. 10 illustrates a three-dimensional coarse subdomain.

The coarse subdivision in three dimensions is performed as follows. Corresponding to each simplified region, there are two coarse subdomains. Each of the coarse subdomains, as illustrated for coarse subdomain 120 in FIG. 10, is bounded by a simplified region 122, also called the symmetric surface, by a terminal radius surface 124 arising from a terminal curve 126, and a boundary surface 128 associated with the simplified region 122. The boundary surface 128 can degenerate into a curve or a point for some reentrant geometries. The description of the coarse subdomain of FIG. 10 discussed only one of the four terminal radius surfaces since the illustrated symmetric surface 122 has four terminal curves.

Each coarse three-dimensional subdomain must be further divided into finite elements. The situation is more complex than in the two-dimensional case because a coarse three-dimensional subdomain need not be a quadrilateral or triangular prism. Instead, as was illustrated in FIG. 10, each coarse subdomain is defined by the bounding surfaces: the symmetric surface 122, the boundary surface 128 and the various terminal radius surfaces 124. Each of these surfaces is of a general shape and there is no immediate way to compute a fine subdivision because the shape of the boundary of the simplified region itself is not restricted to a particular shape.

One approach is to perform a two-dimensional subdivision upon the symmetric surface 122 of the coarse three-dimensional coarse subdomain 120. The simplified surface 122 is, in general, a two-dimensional manifold or surface in three-dimensional space. The subdivision differs from the previously presented two-dimensional subdivision in that there are no holes present but also that the surface is in general not flat so that it is not truly two-dimensional. Two approaches are possible. Mapping techniques are well known that can transform such a warped surface into a flat two-dimensional surface. The previously described symmetric axis transform in two dimensions can then be applied to the mapped surface. Alternatively, the two-dimensional symmetric axis transform can be generalized for a warped surface. In the generalization, the distance metric used to define maximal disc is the distance along geodesics in the symmetric surface. With either of these approaches, the coarse two-dimensional subdivision can be performed upon the symmetric surface 122 and then the coarse two-dimensional subdomains can be finely divided into quadrilateral and triangular two-dimensional elements. The tangetial radii following the boundaries of the two-dimensional elements upon the symmetric surface 122 then define prisms extending from the symmetric surface 122 to the boundary surface 128. The fine subdivision in this third dimension remains to be performed. The fine subdivision in the third dimension can be performed similarly to the two-dimensional fine subdivision. The three-dimensional fine subdivision can use both the two- and three-dimensional radius function to control the size and density of the two-dimensional "elements" into which the simplified surface is divided and to control the number of smaller prisms into which each initial prism is divided.

Figure 11:
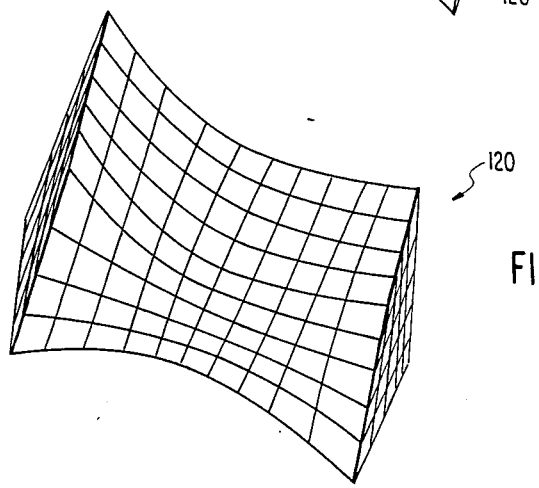
FIG. 11 illustrates the fine subdivision of the coarse subdomain of FIG. 10.

The resultant fine subdivision of the three-dimensional coarse subdomain 120 is shown in FIG. 11, although in this subdomain, no coarse quasi-two-dimensional subdivision was required on the symmetric surface 122 because it was already a quadrilateral.

The invention provides a procedure for automatically generating finite elements (sometimes called a finite element mesh) from a multi-dimensional geometric model. The invention has several advantages over the prior art. It can be completely automated so that no interactive assistance is required from the user. The course subdivision, performed according to the symmetric axis transform, reflects important changes in the geometric shape, such as reentrant corners, protuberances, intrusions and holes. By the use of the radius function produced in the symmetric axis transform, the size and density of the finite elements can be made to reflect automatically the magnitude and nature of the shape changes. The user can specify simple parameters which affect locally the size and density of the finite elements generated. This capability can be used to take into account boundary conditions and material properties. Since both the course and the fine subdivisions are computed using the symmetric axis transform, not an ad hoc technique, the symmetric axis transform theory might prove useful for analyzing the behavior of the algorithms.

Figure 12:
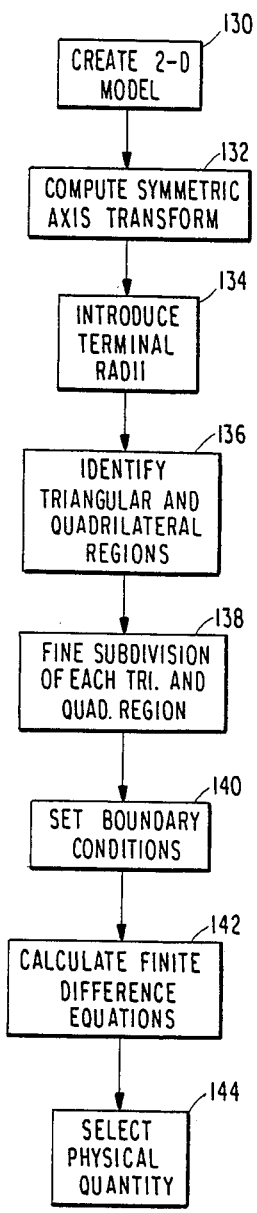
FIG. 12 is a flow diagram for generating finite elements and predicting a physical quantity.

The above method for generating finite elements has been described in somewhat general terms. It is intended that this method be performed on a large computer by means of a computer program written for this task. Such a computer program for the two-dimensional problem would follow the flow chart illustrated in FIG. 12.

In a first step 130, the user would create a two-dimensional model of the body to be simulated. This modeling can be done with commercially available two-dimensional CAD (computer aided design) systems in which the user interacts with a computer via a CRT, a keyboard and possibly other input devices to define the limits of the body. An example of such a system is CADAM, which is a trademarked software package available from the IBM Corporation and which runs on standard computers.

In the second step 132, a computer program takes the computer defined two-dimensional model of the body and computes the symmetric axis transform of the body. The symmetric axis transform is performed according to the formalism of Voronoi diagrams. An algorithm for computing the Voronoi diagrams, and hence, the symmetric axis transform is shown in the technical article by the present inventors, Srinivasan and Nackman, entitled "Voronoi diagram for multiply-connected polygonal domains I: Algorithm", appearing in IBM Journal of Research and Development, vol. 31, no. 3, pp. 361–372. An implementation and use of this algorithm have been described in a technical article by Meshkat and Sakkas, entitled "Voronoi diagram for multiply-connected polygonal domains II: Implementation and application", appearing in IBM Journal of Research and Development, vol. 31, no. 3, pp. 373–381, May 1987.

Voronoi diagrams are a well-known method of splitting a domain into regions of influence, called Voronoi regions. In two dimensions, each Voronoi region is associated with an edge or vertex of the domain boundary such that each region contains points that are closer to that edge or vertex than to any other edge or vertex.

As described in the Srinivasan and Nackman article, their objective is to compute the Voronoi diagram of a multiply-connected polygonal domain. They then describe an algorithm which computes the individual Voronoi diagrams associated with each closed boundary.

The previously described multiply connected domain has both an outer boundary and one or more inner boundaries surrounding internal holes and enclosed by the outer boundary. The inner boundaries will alternatively be referred to as hole boundaries. For the case of an outer boundary and a single inner boundary, the two respective Voronoi diagrams can be computed using a simple extension of the algorithm for computing the Voronoi diagram of a simply-connected polygonal domain without a hole (for example FIG. 1), as described by D. T. Lee in a technical article entitle "Medial Axis Transformation of a Planar Shape," IEEE Transactions Pattern Analysis & Machine Intelligence, Vol. PAMI-4, No. 4, 363-369 (1982). The two individual Voronoi diagrams are superposed together with their merge curve. The merge curve is the bisector between the boundaries whose Voronoi diagrams are being merged. In this example, the merge curve is the locus of points equidistant between the inner and outer boundaries. The merged Voronoi diagram consists of that portion of the Voronoi diagram of the outer boundary that lies outside the merge curve together with that portion of the Voronoi diagram of the inner boundary that lies inside the merge curve.

More generally, the algorithm consists of the following steps:
1. Compute the Voronoi diagram of the outer boundary.
2. Sort the inner boundaries.
3. For each of the inner boundaries, do the following:
   a. Compute the Voronoi diagram of the inner boundary.
   b. Compute the merge curve between the Voronoi diagram of the inner boundary and the merged Voronoi diagram computed thus far.
   c. Discard the extraneous portions of the original Voronoi diagram, thus obtaining the new merged Voronoi diagram.

The heart of the algorithm, and the fundamental difference between this algorithm and those described by D. T. Lee above and by Lee et al in "Generalization of Voronoi Diagrams in the Plane", SIAM Journal of Computing, vol. 10, No. 1, 73–87 (1981) lies in the way in which the merge curve is computed. All of these algorithms compute the merge curve by first finding a starting point on the curve and then traversing the merge curve starting from that point. Srinivasan and Nackman proposed a simple method for finding a starting point by exploiting properties of Voronoi diagrams of multiply-connected polygonal domains (as distinguished from arbitrary sets of points and open line segments).

The algorithm to compute the Voronoi diagram of a multiply-connected polygonal domain is now described in more detail. The input data consists of the outer boundary of the domain and possible inner boundaries of the domain of number H equal to or greater than zero. For convenience, the outer boundary is referred to as boundary 0 and the inner boundaries are referred to as boundaries 1 through H. If, as in the domain of FIG. 1, there is no hole and therefore no inner boundary, then H=0. The algorithm first computes in step 1 the Voronoi diagram of the outer boundary using Lee's algorithm previously described. If there are no hole boundaries, step 1 completes the algorithm. The algorithm in step 2 sorts the hole boundaries, and in step 3 computes and merges in the Voronoi diagrams of the hole boundaries. The output of the algorithm is the Voronoi diagram of the domain.

The algorithm is presented as follows:

Voronoi diagram of a multiply-connected polygonal domain

1. Compute the Voronoi diagram of the outer boundary using Lee's algorithm.
2. For each hole boundary, find the vertex with the largest y-coordinate. Sort the hole boundaries in decreasing order of largest y-coordinate (resolving ties arbitrarily) and renumber the hole boundaries in the sorted order.
3. For i=1 to H do Begin
   a. Use Lee's algorithm to compute the Voronoi diagram of hole boundary i.
   b. Using the procedure described below for finding the starting point, find a starting point, a vertex of hole boundary i, and an element of the boundaries (outer and hole) previously processed.
   c. Using the merge procedure described by Lee in the above cited article, obtain the Voronoi diagram of the union of the outer boundary and the 1-st through i-th hole boundaries.
End The algorithm for finding the starting point and other data required in step 3.b above will now be described. The inputs to the algorithm are the Voronoi diagram of the union of boundaries 0 through i−1 which have previously been merged, the Voronoi diagram of the hole boundary i, and the boundary of hole i. The outputs are a starting point s, a vertex v of hole boundary i, and an element e of boundaries 0 through i−1.

The starting point algorithm is presented as follows:

Finding a starting point

1. Find the topmost vertex (or, in case of ties, one of the topmost vertices) of hole boundary i; let this be vertex v. Let $l_v$ be the upward directed vertical ray from v.
2. Find the region of the Voronoi diagram of the union of boundaries 0 through i-1 that contains v. Let e be the boundary element associated with this region.
3. While true do Begin
   a. Let $l_e$ be the portion of $l_v$ contained in the Voronoi region associated with the boundary element e.
   b. Let s be the intersection of $l_s$ with the bisector between v and e.
   c. If s is not empty then return s, v, and e
      else Begin
      (1) When $l_v$ exits the Voronoi region associated with e, it enters another Voronoi region. Let e be the boundary element that region is associated with.
   End
End Once the Voronoi diagrams have been generated, the symmetric axis transform is generated by eliminating all Voronoi edges emanating from re-entrant (concave) corners. It should be noted that the symmetric axis is a graph within the context of graph theory so that the mathematics of graph theory is available in calculating the symmetric axes.

In the third step 134, the terminal radii are introduced. This procedure is done by first finding all the branch points of the symmetric axis. Finding the branch points is equivalent to treating the symmetric axis as a graph theoretic graph and then finding all nodes (points) with degree of at least three. A node with degree of at least three has three or more arcs incident upon that node. Therefore, finding the branch points of the symmetric axis is done by finding all the points having more than two arcs connected therewith. Such a process of finding the branch points may be performed using a standard depth first search algorithm such as described by Sedgewick in Chapter 29 of a book entitled "Algorithms", published by Addison-Wesley Publishing Co., Reading, MA, 1983.

Once the branch points have been found, the the touching points associated with each branch point are easily determined. The terminal radii are then determined by constructing radii from the branch point to each of the touching points.

Once the terminal radii have been determined, in step 136 the triangular and quadrilateral regions are identified. This process is described before in terms of the mapping function from the boundary of the figure F to the symmetric axis of F.

That portion of the symmetric axis associated with each edge of the object boundary constitutes one edge of quadrilateral region. This portion of the symmetric axis is easily computed as a by-product of the Voronoi algorithm used in step 132. The two terminal radii through the end points of this edge and the object boundary edge constitute the remaining three quadrilateral edges. In some cases, one of the terminal radii will have zero length. This degenerate case reduces the quadrilateral region to a triangular region.

On the other hand, that portion of the symmetric axis associated with each re-entrant (concave) vertex of the object boundary constitutes a triangular region together with the two associated terminal radii.

With all the triangular and quadrilateral regions having been identified, each of these regions is subjected to fine subdivision in step 138. There are two techniques known to be available. One of techniques has been previously described. Another technique uses a well-known mapping technique described by Zienkiewicz in section 8.12 of his book "The Finite Element Method", 3rd ed., published by McGraw-Hill Book Co., London, 1982.

The above steps complete the generation of the finite elements. If a three-dimensional model is required, the basic algorithm for generating the finite elements remains the same. The procedure to compute the symmetric surfaces could either be an extension of the Voronoi diagram approach or an extension of the "line skeleton" approach. The basic line skeleton approach is described by Bookstein in a technical article entitled "The Line-Skeleton" appearing in "Computer Graphics and Image Processing", vol. 11, pp. 123–137, October 1979. The extension is described by one of the present inventors, Nackman, in Chapter 5 of his Ph.D. Thesis, University of North Carolina, 1982, entitled "Three-Dimensional Shape Description Using the Symmetric Axis Transform".

The so generated finite elements can be used in a finite element calculation of approximate solutions for any number of partial differential equations in order to predict physical quantities. Such calculations, examples of which appear below, are fully described in the previously cited reference of Zienkiewicz. That reference fully describes the finite difference forms of various important partial differential equations.

Poisson's equation is used for calculations of heat conduction through a body, that is, of heat flow and the resultant temperature distribution. Heat sources and heat sinks impose boundary conditions on the differential equation.

The bi-harmonic equation is used for calculations of stress analysis in a body. Externally applied loads form the boundary conditions.

The Navier-Stokes equation is a generalized equation for the calculation of fluid flow, both its direction and rate, through a body. The fluid can be either compressible or incompressible. There are usually fluid sources and fluid sinks determining some of the boundary conditions.

Maxwell's equations are used in calculating electromagnetic fields, principally electric and magnetic fields or their associated potentials, within a body. In some situations, the electric and magnetic fields can be decoupled.

The diffusion equations are used for a variety of diffusion phenomena, such as semiconductor transport, within a body. The diffusing field may be identifiable particles, such as electrons, or may represent more abstract field-like quantities. Once again, there may be a diffusion source and a diffusion sink at the boundaries.

The boundary conditions for any surface of the body need to be determined for the calculation. For instance, in electromagnetic calculations, a different boundary condition is imposed on an insulating boundary than on a conducting boundary. Likewise, as mentioned above, sources and sinks are often simulated at part of the boundary of the body.

Sometimes, the body is considered to have uniform characteristics, such as bulk resistivity for current flow, but it may be possible to provide for a non-uniform body by assigning a different value of, for instance, resistivity to each of the generated finite elements.

The calculations with finite elements are not however limited to the above equations or phenomena but are limited only to the prediction of physical quantities which are described by a partial differential equation valid within a body.

The prediction is performed by setting the boundary conditions of the body in step 140 along with any sinks, sources and internal characteristics of the body. Then in step 142, the resultant finite difference equations are calculated. In step 144, the desired physical quantities are calculated and thereby predicted. For instance, the flow rate through an orifice is an area integral of the gradient of a flow potential. For another example, a maximum electric field is the maximum gradient of the electric potential in that body.

Having thus described our invention, what we claim as new, and desire to secure by Letters Patent is:

1. A method for generating finite elements of an object defined by a geometric model and predicting a physical quantity of said object, comprising the steps of:
   a first step of providing an object defined by a geometric model of a predetermined physical medium, wherein said first step includes inputting into a computer system said geometric model, said computer system including an image display screen displaying said geometric model;
   a second step of transforming, using a symmetric axis transform, the object defined by said geometric model into a plurality of sub-objects, each defined by the symmetric axes of said symmetric axis transform, said geometric model and linkages from branches or terminators of said axes to said geometric model;
   a third step of transforming each sub-object into finite elements, using said symmetric axes and radius functions of said axes;
   calculating a finite difference equation for said finite elements; and
   predicting a physical quantity of a physical phenomenon in said physical medium from said calculated finite difference equation.

2. A method as recited in claim 1, wherein said third transforming step includes the steps of:
   dividing a first symmetric axis into first intervals;
   constructing radii between end points of said first intervals to a boundary of said geometric model; and
   dividing said radii into an equal number of second intervals, the number and size of said second interval depending on a radius function of said first symmetric axis.

3. A method as recited in claim 1, wherein said symmetric axes are the locus of the centers of maximal n-dimensional spheres contained in said geometric model, where n is the dimension of said geometric model and is greater than 1, and a radius function of said transform for a point of said axis is the radius of said maximal sphere the center of which is at said point.

4. A method as recited in claim 3, wherein n=2 and said sub-objects are triangles or quadrilaterals having possibly curved surfaces.

5. A method as recited in claim 4, wherein said branches are points on said symmetric axes having three or more nearest neighboring points on said symmetric axes and terminators are points on said axes having only one nearest neighbor on said axes.

6. A method as recited in claim 5, wherein said linkages are radii from said branches and terminators and that touch said geometric model from at least one direction.

7. A method as recited in claim 3, wherein n=3.

8. A method as recited in claim 7, wherein said symmetric axes are symmetric surfaces and wherein said third step of transforming includes a step of transforming said symmetric surfaces using a symmetric axis transform in two-dimensions.

9. A method as recited in claim 1, wherein said finite difference equation is a finite difference form of Poisson's equation and said physical phenomenon is a flow of heat through said physical medium.

10. A method as recited in claim 1, wherein said finite difference equation is a finite difference form of the bi-harmonic equation and said physical phenomenon is a distribution of stress in said physical medium.

11. A method as recited in claim 1, wherein said finite difference equation is a finite difference form of the Navier-Stokes equation and said physical phenomenon is a flow of a fluid through said physical medium.

12. A method as recited in claim 1, wherein said finite difference equation is a finite difference form of Maxwell's equations and said physical phenomenon is a distribution of an electromagnetic field in said physical medium.

13. A method as recited in claim 1, wherein said finite difference equation is a finite difference form of a diffusion equation and said physical phenomenon is a distribution of a diffusion field across said physical medium.

14. A method for generating finite elements of an object defined by a geometric model and predicting a physical quantity of said object, comprising the steps of:
  a first step of providing an object defined by a geometric model of a predetermined physical medium;
  a second step of transforming, using a symmetric axis transform, the object defined by said geometric model into a plurality of sub-objects, each defined by the symmetric axes of said symmetric axis transform, said geometric model and linkages from branches or terminators of said axes to said geometric model;
  a third step of transforming each sub-object into finite elements, using said symmetric axes and radius functions of said axes;
  calculating a finite difference equation for said finite elements;
  predicting a physical quantity of a physical phenomenon in said physical medium from said calculated finite difference equation; and
  visually displaying a result of said predicted quantity.

15. A method as recited in claim 14, wherein said displaying step displays said result on an image display screen in a two-dimensional pictorial representation.

16. A method as recited in claim 14, wherein said third transforming step includes the steps of:
  dividing a first symmetric axis into first intervals;
  constructing radii between end points of said first intervals to a boundary of said geometric model; and
  dividing said radii into an equal number of second intervals.

17. A method as recited in claim 15, wherein said symmetric axes are the locus of the centers of maximal n-dimensional spheres contained in said geometric model, where n is the dimension of said geometric model and is greater than 1.

18. A method as recited in claim 17, wherein $n=2$ and said sub-objects are triangles or quadrilaterals having possibly curved surfaces.

19. A method as recited in claim 14, wherein said first step of providing includes inputting into a computer system said geometric model, said computer system including an image display screen displaying said geometric model.

* * * * *